United States Patent
Fujimori et al.

(10) Patent No.: US 7,292,382 B2
(45) Date of Patent: Nov. 6, 2007

(54) LIGHT CONTROL UNIT

(75) Inventors: Yoshikazu Fujimori, Kyoto (JP); Ken Nakahara, Kyoto (JP); Takashi Nakamura, Kyoto (JP)

(73) Assignee: Rohm Co., Ltd. (JP)

( * ) Notice: Subject to any disclaimer, the term of this patent is extended or adjusted under 35 U.S.C. 154(b) by 0 days.

(21) Appl. No.: 11/346,936

(22) Filed: Feb. 3, 2006

(65) Prior Publication Data
US 2006/0126360 A1 Jun. 15, 2006

Related U.S. Application Data

(63) Continuation of application No. PCT/JP2004/011381, filed on Aug. 6, 2004.

(30) Foreign Application Priority Data

Aug. 7, 2003 (JP) ............................. 2003-289406
Sep. 24, 2003 (JP) ............................. 2003-332543

(51) Int. Cl.
*G02F 1/03* (2006.01)
(52) U.S. Cl. ...................... 359/254; 359/263; 359/318; 359/320; 359/323; 345/84
(58) Field of Classification Search ................ 359/197, 359/245, 251–252, 254, 255, 256–258, 263, 359/315, 318, 320, 323; 345/55, 84, 206, 345/214, 98, 99, 103
See application file for complete search history.

(56) References Cited

U.S. PATENT DOCUMENTS 6,819,463 B2* 11/2004 Noonan ...................... 359/245

2005/0168663 A1* 8/2005 Miyachi et al. ............... 349/24
2006/0138451 A1* 6/2006 Fujimori et al. ............. 257/113

FOREIGN PATENT DOCUMENTS

| JP | 5-257103 | 10/1993 |
| JP | 7-146657 | 6/1995 |
| JP | 2001-337303 | 12/2001 |
| JP | 2002-297008 | 10/2002 |

OTHER PUBLICATIONS

An electronic translation of Japanese patent publication, JP 2001-337303, from the website of the National Center for Industrial Property Information and Training (as of Oct. 24, 2006).*
International Search Report for International Application No. PCT/JP2004/011381 dated Nov. 9, 2004.
International Preliminary Report on Patentability for International Application No. PCT/JP2004/011381 dated May 18, 2006.

* cited by examiner

*Primary Examiner*—Evelyn A. Lester
(74) *Attorney, Agent, or Firm*—Cantor Colburn LLP

(57) ABSTRACT

A light control unit comprises: a substrate; an insulating film; a first transistor; a reflecting film formed on the insulating film; a light modulating film formed on the reflecting film; a plurality of pairs of electrodes arranged two-dimensionally on the light modulating film; and a polarizing plate formed on a first electrode. Here, the light modulating film is made of a material that varies in refractive index in accordance with the intensity of an electric field applied thereto. For such a material, PLZT containing Pb, Zr, Ti, and La as constituent elements may be used.

15 Claims, 16 Drawing Sheets

$$\begin{pmatrix} f_1 \\ f_2 \\ f_3 \\ f_4 \\ f_5 \\ f_6 \\ f_7 \\ f_8 \end{pmatrix} = \begin{pmatrix} A_{11} & A_{12} & & & & & & A_{18} \\ A_{21} & & & & & & & \\ & & & & & & & \\ & & & & & & & \\ & & & & & & & \\ & & & & & & & \\ & & & & & & & \\ A_{81} & & & & & & & A_{88} \end{pmatrix} \begin{pmatrix} x_1 \\ x_2 \\ x_3 \\ x_4 \\ x_5 \\ x_6 \\ x_7 \\ x_8 \end{pmatrix}$$

OUTPUT    OPERATION MATRIX    INPUT

CALCULATION FORMULA

LIGHT CONTROL UNIT

CROSS-REFERENCE TO RELATED APPLICATION

The present application is a continuation of PCT/JP2004/011381, filed on Aug. 6, 2004, the entire contents of which are incorporated herein by reference, and which claims the benefit of the date of the earlier filed Japanese Patent Applications No. JP 2003-289406 filed on Aug. 7, 2003 and No. JP 2003-332543 filed on Sep. 24, 2003.

BACKGROUND OF THE INVENTION

1. Field of the Invention

The invention relates to a light control unit.

2. Description of the Related Art

For high-capacity recording, digital information recording systems using the principle of hologram have been known recently (for example, see Japanese Patent Laid-Open Publication No. 2002-297008).

FIG. 14 is a diagram showing an example of a hologram recording apparatus. The hologram recording apparatus 100 chiefly comprises a laser source 102, a beam splitter 104, a beam expander 106, a spatial light modulator SLM 108, a hologram pattern writing unit 110, a Fourier transform lens 112, a recording medium 114, a mirror 116, and a rotating mirror 118. Here, a display unit of transmission type is used as the spatial light modulator SLM 108.

In the hologram recording apparatus 100, laser light emitted from the laser source 102 is split into two beams by the beam splitter 104. One of the beams is expanded in diameter through the beam expander 106, and irradiates the spatial light modulator SLM 108 as parallel light. The hologram pattern writing unit 110 sends a hologram pattern to the spatial light modulator SLM 108 in the form of an electric signal.

Based on the electric signal received, the spatial light modulator SLM 108 forms a hologram pattern on a plane surface. The light irradiating the spatial light modulator SLM 108 is transmitted through the spatial light modulator SLM 108 for light modulation, thereby being turned into signal light that contains the hologram pattern. This signal light is passed through the Fourier transform lens 112 for Fourier transform, and focused into the recording medium 114.

Meanwhile, the other of the beams split by the beam splitter 104 is introduced via the mirror 116 and the rotating mirror 118 into the recording medium 114 as reference light. In the recording medium 114, the optical path of the signal light containing the hologram pattern and that of the reference light intersect to form an optical interference pattern. The entire optical interference pattern is recorded on the recording medium 114 in the form of changes in refractive index (refractive index lattice).

The hologram recording apparatus 100 records a single frame of image onto the recording medium 114 in this way. When the recording of a single frame of image is completed, the rotating mirror 118 is rotated by a predetermined amount and shifted in position by a predetermined amount in parallel. The angle of incidence of the reference light on the recording medium 114 is thus changed, and the second frame of image is recorded in the same procedure. Such processing is repeated for angular multiplexing recording.

The spatial light modulator SLM of the hologram recording apparatus may be made of materials that have electrooptic effect, such as PLZT. PLZT is a transparent ceramic having the composition of $(Pb_{1-y}La_y)(Zr_{1-x}Ti_x)O_3$. The electrooptic effect refers to the phenomenon that a substance causes polarization with a change in its refractive index when an electric field is applied to the substance. Through the use of the electrooptic effect, it is possible to switch the phase of light by turning on/off the applied voltage. The light modulating materials having the electrooptic effect can thus be applied to optical shutters such as the spatial light modulator SLM.

For these applications including optical shutter devices, bulk PLZT has been widely used conventionally (Japanese Patent Laid-Open Publication No. Hei 5-257103). It is difficult, however, for the optical shutters using bulk PLZT to meet demands for finer configuration, higher integration, lower operating voltage, and lower cost. Besides, the bulk method includes mixing metal oxides, or materials, and then processing the mixture at high temperatures of 1000° C. and above. If this method is applied to the device formation processes, a lot of constraints will thus be imposed on the selection of the materials, the device structures, and so on.

Under the circumstances, attempts have been made to apply a thin film of PLZT formed on a base member to light control devices, instead of bulk PLZT. Japanese Patent Laid-Open Publication No. Hei 7-146657 describes a display unit in which a PLZT film is formed on a glass or other transparent substrate, and comb-shaped electrodes are formed thereon. This display unit has the configuration that a display substrate having the PLZT film formed thereon is interposed between polarizing plates. Here, electrode terminals of the individual pixels are connected to an external drive circuit. Desired pixels are then driven so that transmission light from a light source arranged on one side of the display substrate gives desired display.

In order for the light modulating film such as the PLZT film described above to be put into practical use as an optical shutter device or the like, however, it is necessary that a drive circuit for turning on/off the voltage applied to the light modulating film be formed on the substrate along with the light modulating film. In such configurations as described in the aforementioned Japanese Patent Laid-Open Publication No. Hei 7-146657, the area where the drive circuit is formed on thus cannot be used as a display area. This has produced the problem that the effective display area cannot be secured sufficiently. Besides, the display unit of transmission type as described above has also had the problem that if visible light is used as the irradiation light, the drive circuit cannot be formed on the substrate of silicon or the like which is not transparent to the visible light.

SUMMARY OF THE INVENTION

The present invention has been achieved in view of the foregoing circumstances. Thus, at least an embodiment of the present invention may provide a technology for securing a sufficient display area for a light control unit that has a light modulating film formed on a substrate, even if a drive circuit of the light modulating film is formed on the substrate.

A light control unit according to at least an embodiment of the present invention may comprises: a substrate; a reflecting film formed on the substrate; a solid light modulating film formed on the reflecting film, the light modulating film being made of a material that varies in refractive index in accordance with an electric field applied thereto; and an electrode formed on the light modulating film.

As above, since the reflecting film is formed between the substrate and the light modulating film, light modulated in the light modulating film can be reflected from the reflecting film for output. Consequently, even if such components as a drive circuit of the light modulating film is formed, for example, inside the substrate or between the substrate and the reflecting film, the entire area of the light modulating film can be used as the display area. Moreover, it is possible to make the substrate out of a material not transparent to the light that irradiates the light modulating film. Consequently, even when the substrate is made of a material not transparent to visible light, such as silicon, it is possible to irradiate the light modulating film with the visible light and modulate the phase of the light reflected from the reflecting film for output. Here, the reflecting film may be a film of metal such as Pt, for example. The light control unit may further include a polarizing plate formed on the light modulating film. This makes it possible to extract the phase-modulated light visibly through the polarizing plate. Furthermore, the electrode may be a pair of electrodes. The reflecting film may otherwise be made of a conductive material so that the reflecting film and the single electrode are used as a pair of electrodes. In this case, the electric field is applied in the direction of thickness of the light modulating film.

When the light modulating film is made of a solid material, its refractive index varies with a change in electron distribution. This improves the response to the application of the electric field. As a result, it is possible to switch on/off the light at high speed. Moreover, the use of the solid material for the light modulating film can enhance the durability as compared to the cases where a film in a liquid crystal state is used. Examples of materials available for such a solid light modulating film include PLZT, $LiNbO_3$, GaAs-MQW, and $SBN((Sr,Ba)Nb_2O_6)$. As will be described later, PLZT is preferable.

In the light control unit according to the present invention, the electrode may include a plurality of pairs of electrodes arranged in a matrix.

When the plurality of pairs of electrodes arranged thus are given respective different voltages, it is possible to form an image pattern made of a plurality of pixels on the light modulating film. Since the light control unit according to the present invention uses a solid material for the light modulating film, it is possible to switch on/off the light at high speed and reduce pixel-to-pixel deviations in brightness.

In the light control unit according to at least an embodiment of the present invention, the light modulating film may be made of a material that varies in refractive index in proportion to the square of the electric field applied thereto.

When the light modulating film is made of a material having such quadratic electrooptic effect, it is possible to switch on/off the light at higher speed.

In the light control unit according to at least an embodiment of the present invention, the light modulating film is made of PLZT containing Pb, Zr, Ti, and La as constituent elements.

In the light control unit according to at least an embodiment of the present invention, the light modulating film has a relative dielectric constant of 1200 or higher at a frequency of 1 MHz.

In the light control unit according to at least an embodiment of the present invention, the light modulating film is made of polycrystalline PLZT containing Pb, Zr, Ti, and La as constituent elements, and has a La content within a range of 5 at % (atomic percentage) to 30 at %.

In the light control unit according to at least an embodiment of the present invention, the light modulating film is made of polycrystalline PLZT containing Pb, Zr, Ti, and La as constituent elements, has a La content within a range of 5 at % to 30 at %, and has a relative dielectric constant of 1200 or higher at a frequency of 1 MHz.

The light modulating film according to at least an embodiment of the present invention is made of polycrystalline PLZT containing Pb, Zr, Ti, and La as constituent elements, and has a La content within a range of 5 at % to 30 at %. Grains constituting the polycrystalline PLZT have an average grain size of 800 nm or greater.

The light modulating film according to at least an embodiment of the present invention is made of polycrystalline PLZT containing Pb, Zr, Ti, and La as constituent elements, and has a La content within a range of 5 at % to 30 at %. The value of $I(111)/I(110)$ is higher than or equal to 1, where $I(110)$ is the X-ray diffraction intensity on the (110) plane of the polycrystalline PLZT, and $I(111)$ is the X-ray diffraction intensity on to (111) plane.

Incidentally, as employed in the present invention, the La content of the film in the range of 5 at % to 30 at % shall refer to that the ratio of the number of La atoms to the sum of the numbers of Zr and Ti atoms falls within the range of 5% to 30%.

PLZT is a ferroelectric, and changes in polarity at a rate proportional to the exponential of the electric field. This makes it possible to switch on/off light at higher speed. The amount of increase of the electric field necessary for switching on/off the light can also be made smaller. Since PLZT crystals have low anisotropy, differences in switching speed between individual crystal grains are small. This can reduce deviations in speed at the time of switching.

In addition, the polycrystalline PLZT according to at least an embodiment of the present invention has a high La composition. It thus shows a stable high quadratic electrooptic effect, and exhibits excellent performance as a light modulating film.

FIG. 15 is a phase diagram showing the relationship between the composition and the film characteristic of polycrystalline PLZT. As shown in FIG. 15, the quadratic electrooptic effect occurs from compositions of relatively high La contents. Then, the inventor attempted to form PLZT films from materials of high lanthanum compositions by a sol-gel method, but the resultant films showed low relative dielectric constants and small Kerr constants.

The reason for this is not exactly known, whereas it seems to be ascribable to how lanthanum exists in the polycrystalline PLZT. More specifically, in the polycrystalline PLZT formed by the foregoing process, lanthanum segregates on the grain boundaries of the polycrystalline PLZT, not being taken into the grains. In other words, PZT and La oxides lie in the film separately from each other, which seems to be responsible for a drop in the relative dielectric constant. Provided that PZT and La oxides segregate from each other to form individual domains, the relative dielectric constant of the film is expected to approach the areal average of the relative dielectric constants of the respective materials. Here, lanthanum oxide films have a relative dielectric constant of the order of 30, a value much smaller than that of PZT (1000 or higher). Such a form, when taken, can thus lower the relative dielectric constant of the entire film significantly.

Consequently, the inventor has conducted further research on how to fabricate a film that has a high lanthanum composition and a high relative dielectric constant. As a result, the inventor has found that some conditions on the manufacturing processes of the sol-gel method can be adjusted to obtain films having higher relative dielectric constants. Specifically, for example, in the process of cooling that follows heat treatment for grain growth, the cooling rate can be increased to suppress a drop in the relative dielectric constant ascribable to lanthanum precipitation. This method can be introduced to manufacture a high dielectric constant film that exhibits an excellent quadratic electrooptic effect with stability.

The light modulating film described above has a high lanthanum composition with a La content in the range of 5 at % to 30 at %. The polycrystalline PLZT is given a high relative dielectric constant of 1200 or above at a frequency of 1 MHz. As mentioned previously, the relative dielectric constant provides an indication of whether or not lanthanum is taken into grains. Such a high relative dielectric constant is achieved by the form that a considerable amount of lanthanum is taken into the grains of the polycrystalline PLZT.

This structure, as described above, can be fabricated by increasing the cooling rate in the process of cooling after the heat treatment for grain growth. This structure is suitably used for a device that exhibits a high quadratic electrooptic effect with stability. Incidentally, the light modulating film may be made of materials other than polycrystalline PLZT as long as they show a relative dielectric constant of 1200 or higher at a frequency of 1 MHz.

Now, in the light modulating film, the grains constituting the polycrystalline PLZT are given an average grain size of 800 nm or greater. This makes lanthanum easier to be taken into the grains of the polycrystalline PLZT, whereby a high quadratic electrooptic effect is exerted with stability. Moreover, the large particle sizes of the grains lower the density of the grain boundaries, thereby suppressing dispersion of incident light. Consequently, when this light modulating film is applied to a light control device that utilizes the quadratic electrooptic effect, it is possible to provide an excellent device of high efficiency.

In the light modulating film, the value of $I(111)/I(110)$ is higher than or equal to 1, where $I(110)$ is the X-ray diffraction intensity on the (110) plane of the polycrystalline PLZT, and $I(111)$ is the X-ray diffraction intensity on the (111) plane. That is, in this structure, the crystal grains of the polycrystalline PLZT are oriented in the (111) direction preferentially.

When PLZT crystal grains are attempted to be oriented in the (100) direction preferentially, light dispersion increases if there are (001)-oriented crystals beside the (100)-oriented crystals. In contrast, the preferential orientation in the (111) direction can reduce deviations in the direction of crystal orientation. It is therefore possible to suppress light dispersion at grain boundaries, thereby enhancing the electrooptic effect. Incidentally, crystal structures dominant in the PLZT films according to at least an embodiment of the present invention are cubic and tetragonal. The arrangement of these crystal grains inside the film can thus be optimized to exert the quadratic electrooptic effect stably.

In at least an embodiment of the present invention, a peak half width of the X-ray diffraction on the (111) plane is smaller then or equal to 5°, which allows enhanced film crystallinity. It is therefore possible to increase the electrooptic effect.

Furthermore, a method of manufacturing a light modulating film according to at least an embodiment of the present invention comprises applying a liquid containing Pb, Zr, Ti, and La onto a surface of a substrate and drying the same to form a film before heating the film for crystallization and then cooling it at a rate higher than 1200° C./min.

This manufacturing method includes the rapid cooling after the heat treatment. Such cooling can suppress a drop in the relative dielectric constant ascribable to the precipitation of lanthanum. A high dielectric constant film that shows an excellent quadratic electrooptic effect stably can thus be manufactured with stability. Through the use of such a method, a light modulating film having the foregoing favorable characteristics can be formed, for example, on a reflecting film that is formed on the substrate of silicon or the like.

The light control unit according to at least an embodiment of the present invention may further include an electrode switching device interposed between the substrate and the reflecting film. The light control unit according to at least an embodiment of the present invention may further include an insulating film interposed between the substrate and the reflecting film. The switching device may be formed in the insulating film. The light control unit according to at least an embodiment of the present invention may further include a memory cell which retains data to be applied to a pair of electrodes, the memory cell being interposed between the substrate and the reflecting film.

The switching device may be a MOS transistor formed on the silicon substrate, for example. The memory cell may be an SRAM formed on the silicon substrate, for example. When the switching device and the memory cell are thus formed on the backside of the reflecting film (the side opposite from where the light modulating film is formed), the entire area of the light modulating film can be used as the display area. This allows the entire backside of the reflecting film to be used as an area for forming drive circuits. It is therefore possible to form drive circuits having a variety of functions.

The light control unit according to at least an embodiment of the present invention may further include wiring laid between the substrate and the reflecting film, in connection with the electrode.

In the light control unit according to at least an embodiment of the present invention, the pair of electrodes may be formed in a comb shape each and ranged so that their teeth are staggered and opposed to each other. spacing between the electrodes. It is therefore possible to lower the voltage to be applied between the electrodes while controlling the refractive index of the light modulating film with high precision. In this case, the electric field is applied in a direction substantially perpendicular to the direction of thickness of the light modulating film.

Up to this point, description has been given of the configurations of the present invention. Any combinations of these configurations are also intended to constitute applicable aspects of the present invention. Moreover, any conversions of the expressions of the present invention into other categories are also intended to constitute applicable aspects of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE PREFERRED EMBODIMENTS

Light control units described in the embodiments below may be applied to spatial light modulators SLM of hologram recording/reproducing apparatuses, display units, optical communication switches, optical communication modulators, optical arithmetic units, encryption circuits, and so forth.

First Embodiment

Figure 1:
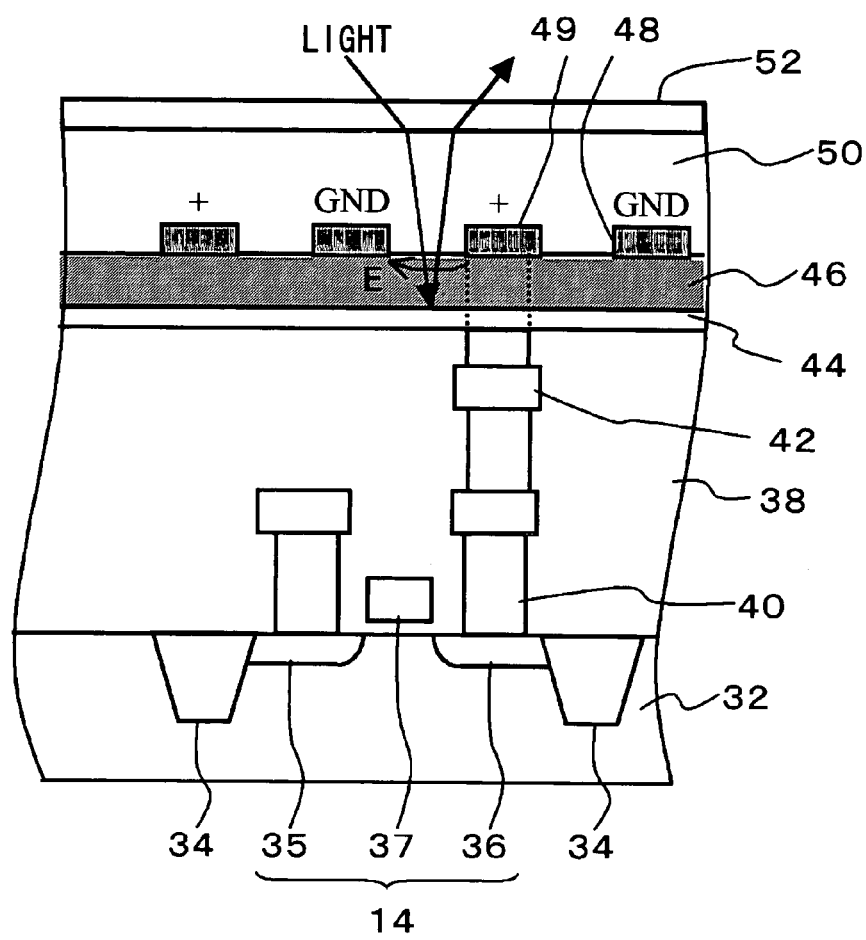
FIG. 1 is a partial sectional view showing the configuration of a light control unit according to a first embodiment of the present invention.

FIG. 1 is a partial sectional view showing the configuration of a light control unit 8 according to a first embodiment of the present invention. The light control unit 8 includes: a substrate 32; an insulating film 38 formed on the substrate 32; a reflecting film 44 formed on the insulating film 38; a light modulating film 46 formed on the reflecting film 44; a first electrode 48 and a second electrode 49 arranged on the light modulating film 46; and a protection film 50 formed to cover the first electrodes 48 and second electrodes 49. In addition, a polarizing plate 52 is placed on the protection film 50. While in this configuration the first electrode 48 and the second electrode 49 are arranged on the light modulating film 46, it is possible to form the first electrode 48 and second electrodes 49 on the reflecting film 44 and form the light modulating film 46 thereon.

The light modulating film 46 according to the present embodiment is made of a material that varies in refractive index in accordance with the intensity of an electric field applied thereto. The light modulating film 46 preferably is a solid film. Among the materials available for such a film are PLZT, $LiNbO_3$, GaAs-MQW, $SBN((Sr,Ba)Nb_2O_6)$, and the like. Of these, PLZT is preferably used. Preferred forms of PLZT will be described later.

The substrate 32 is provided with element isolation regions 34, a drain (or source) 35, and a source (or drain) 36. The substrate 32 may be a monocrystalline silicon substrate. A gate 37 is formed in the insulating film 38, thereby constituting a first transistor 14. The insulating film 38 is made of a silicon oxide film, for example. The insulating film 38 is also provided with plugs 40 and wiring 42 which are formed in connection with the source 36. The wiring 42 is made of aluminum, for example. The plugs 40 are made of tungsten, for example.

The reflecting film 44 (approximately 100 nm in thickness) may be made of Pt, for example. The light modulating film 46 may be formed to a thickness of approximately 1.2 µm, for example.

The first electrode 48 and the second electrode 49 (each having a thickness of approximately 150 nm) may be made of Pt, ITO (Indium Tin Oxide), $IrO_2$, or the like, for example. When formed on the light modulating film 46, these first electrode 48 and second electrodes 49 are preferably made of a transparent material such as ITO. With $IrO_2$, the first electrode 48 and second electrodes 49 can also be used as transparent films if they are given a small thickness (for example, approximately 50 nm or so). This makes it possible to widen the display area of each pixel. The protection film 50 (approximately several micrometers in thickness) may be made of SiN or alumina, for example.

Figure 2:
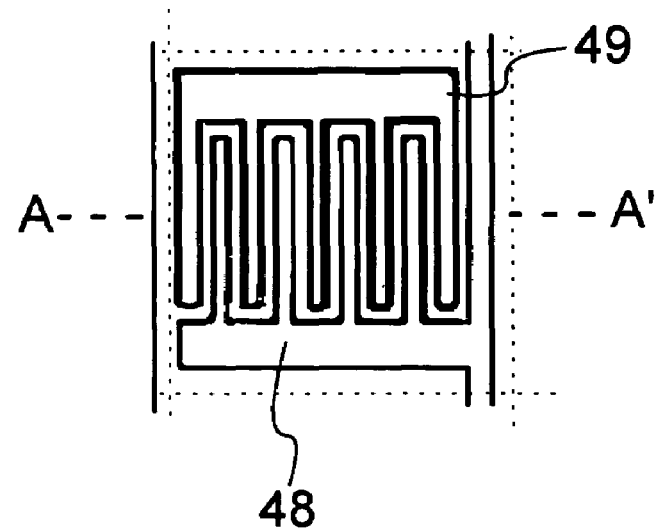
FIG. 2 is a top view showing the configuration of a first electrode and a second electrode.

FIG. 2 is a top view showing the configuration of the first electrode 48 and the second electrode 49. The first electrode 48 and the second electrode 49 are formed in a comb shape each, and arranged so that their teeth are interposed between the teeth of the other. In the present embodiment, each pixel is composed of a pair of comb-shaped first electrode 48 and second electrodes 49. Here, the first electrode 48 and the second electrode 49 may be spaced by 0.5 to 1.5 µm, for example. The teeth of the first electrode 48 and second electrodes may have a width of 0.5 to 1.5 µm, for example. When the spacing between the first electrode 48 and second electrodes 49 falls within this range, it is possible to reduce the difference in potential between the first electrode 48 and second electrodes 49 while controlling the refractive index of the light modulating film 46 with high precision. FIG. 1 corresponds to the cross section taken along the line A-A' of FIG. 2.

Returning to FIG. 1, the first electrode 48 is grounded while brightness data is applied to the second electrode 49. In the area constituting a single pixel of the light modulating film 46, the refractive index of the light modulating film 46 varies in accordance with the voltage applied to the second electrode 49. In this state, when the light control unit 8 is irradiated with light from above the polarizing plate 52, the irradiating light is passed through the polarizing plate 52 and incident on the light modulating film 46 through the protection film 50. Here, the light incident on the light modulating film 46 is refracted in accordance with the refractive index of the light modulating film 46 in that area. The light incident on the light modulating film 46 is reflected by the reflecting film 44, passed through the light modulating film 46 and the protection film 50, and emitted from the polarizing plate 52. Here, the transmittance of the light emitted from the polarizing plate 52 varies depending on the refractive index of the light modulating film 46. The brightness data of each frame can thus be displayed on the polarizing plate 52.

Figure 3:
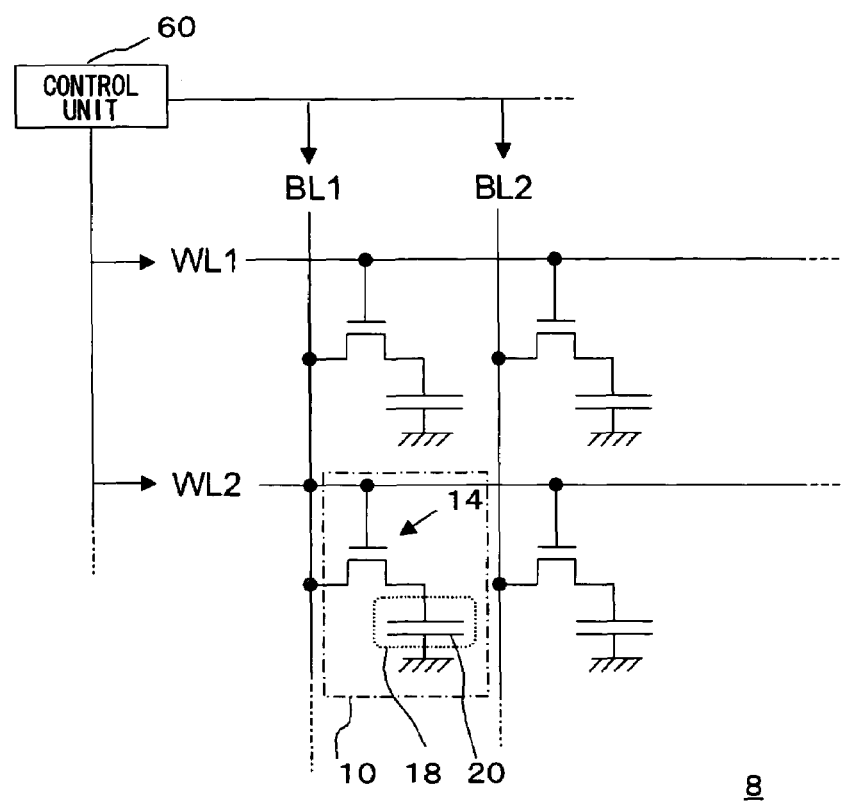
FIG. 3 is a circuit diagram showing the configuration of the light control unit shown in FIG. 1.

FIG. 3 is a circuit diagram showing the configuration of the light control unit 8 shown in FIG. 1.

The light control unit 8 includes a plurality of pixels 10 arranged two-dimensionally, and a control unit 60 for controlling writing and the like of brightness data to these pixels 10. Although now shown in the drawings, the light control unit 8 may also include such circuits as a data control circuit which controls a plurality of bit lines BL and a selection control circuit for controlling a plurality of word lines WL. In that case, the control unit 60 controls these control circuits.

The pixels 10 include a first transistor 14 and an optical device 20 each. Here, the optical device 20 is composed of the light modulating film 46, the first electrode 48, and the second electrodes 49 which are shown in FIG. 1. In the present embodiment, the optical device 20 also functions as a first memory cell 18 which retains the brightness data of the optical device 20 for the current frame.

In the first transistor 14, the drain (or source) is connected to a bit line BL1, and the gate to a word line WL2. The source (or drain) is connected to one of the electrodes of the optical device 20 (the second electrode 49 in FIG. 1). The other electrode of the optical device 20 (the first electrode 48 in FIG. 1) is grounded.

In this state, the control unit 60 selects the word line WL1 and the bit line BL1, the word line WL1 and the bit line BL2, . . . in succession, thereby turning on the first transistors 14 of the pixels in the first row and writing brightness data to the first memory cells 18. When the writing of the brightness data to the first memory cells 18 of the pixels 10 in the first row is completed, the control unit 60 selects the word line WL2 and the bit line BL1, the word line WL2 and the bit line BL2, . . . in succession. The control unit 60 thereby writes brightness data to the first memory cells 18 of the pixels 10 in the second row.

In this way, the control unit 60 writes brightness data to all the pixels 10 of the light control unit 8. When the brightness data is written to the first memory cells 18 of all the pixels 10, the control unit 60 starts to write brightness data on the next frame, selecting the word line WL1 and the bit line BL1 again. Here, in each of the pixels 10, the first transistor 14 functions as a switching device so that the optical device 20 emits light in accordance with its brightness data.

Figure 4:
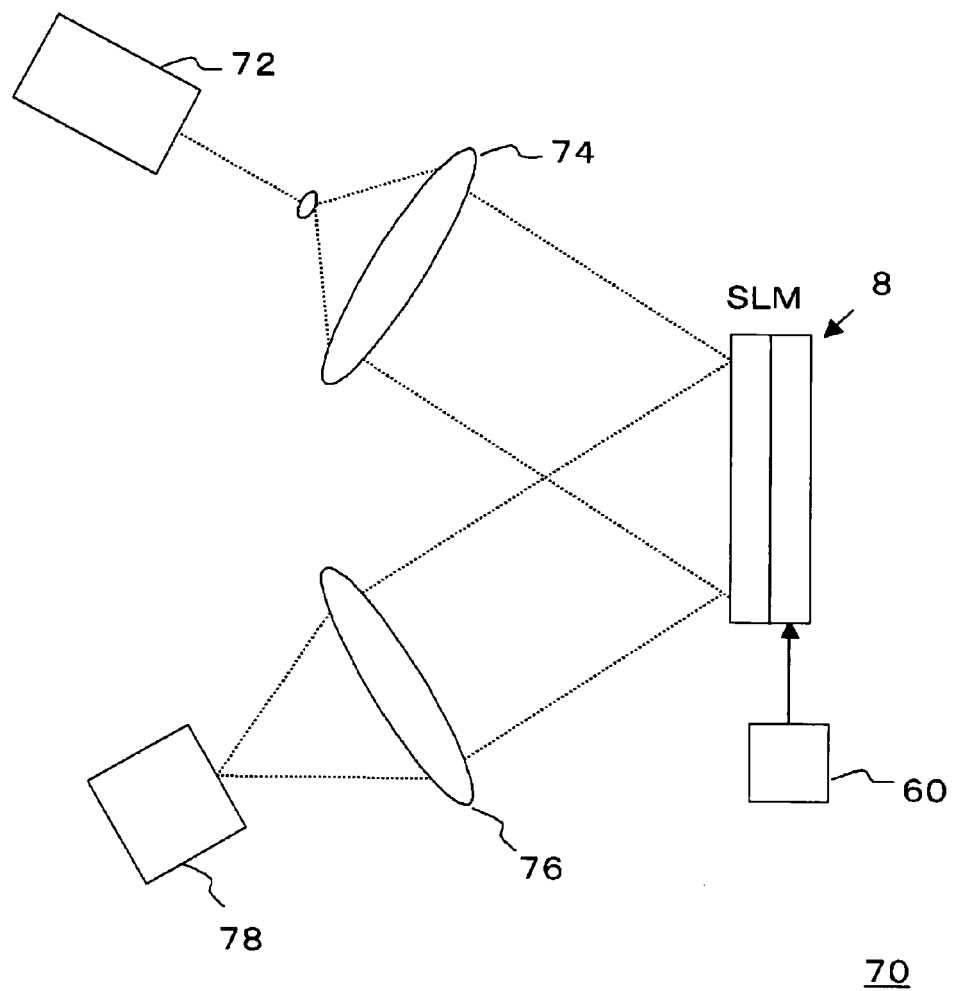
FIG. 4 is a diagram showing the configuration of a hologram recording apparatus.

FIG. 4 is a diagram showing a hologram recording apparatus in which the optical control unit 8 according to the present embodiment is used as a spatial light modulator SLM. The hologram recording apparatus 70 includes a laser source 72, a beam expander 74, a Fourier transform lens 76, and a recording medium 78. The control unit 60 controls the formation of a hologram pattern by the spatial light modulator SLM.

In the hologram recording apparatus 70, laser light emitted from the laser source 72 is split into two beams by a not-shown beam splitter. One of the beams is used as reference light, being introduced into the recording medium 78. The other beam is expanded in diameter through the beam expander 74, and irradiates the spatial light modulator SLM (light control unit 8) as parallel light. Here, the light control unit 8 forms a hologram pattern in accordance with the differences in potential between the first electrode 48 and second electrodes 49 of the respective pixels. The light irradiating the spatial light modulator SLM is thus reflected from the spatial light modulator SLM as signal light containing the hologram pattern. This signal light is passed through the Fourier transform lens 76 for Fourier transform, and focused into the recording medium 78. In the recording medium 78, the optical path of the signal light containing the hologram pattern and that of the reference light intersect to form an optical interference pattern. The entire optical interference pattern is recorded on the recording medium 78 in the form of changes in refractive index (refractive index lattice).

Figures 5A, 5B:
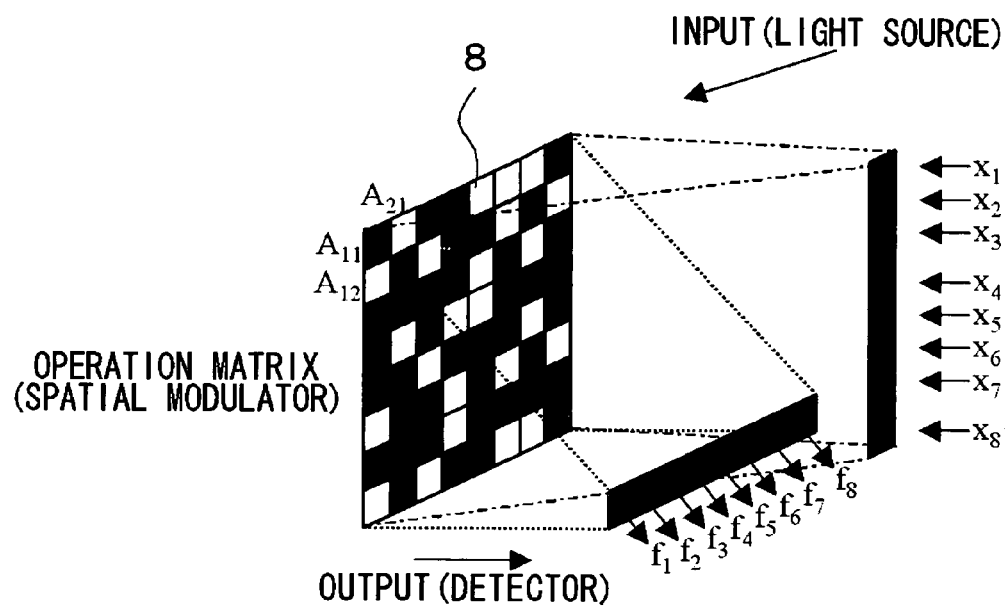
FIG. 5A is a diagram showing an optical arithmetic unit.
FIG. 5B is a diagram showing the calculation formula for determining an output vector through logical operation between an input vector and a plurality of pixel vectors (operation matrix)

FIGS. 5A and 5B are diagrams showing an example where the light control unit 8 according to the present embodiment is applied to an optical arithmetic unit. As shown in FIG. 5A, the display screen of the light control unit 8 shows a matrix of pixel vectors. When the light control unit 8 is irradiated with light, or an input vector, from a light source, it realizes logical operations between the input vector and the plurality of pixel vectors in parallel. The resultant is detected by a detector as an output vector. Consequently, as shown in FIG. 5B, the logical operations between the input vector (inputs $X_1$ to $X_8$) and the plurality of pixel vectors (operation matrix) can be performed in parallel to determine the output vector (outputs $f_1$ to $f_8$). Since the optical control unit 8 can be used to determine the output vector by a single operation, it is possible to achieve high-speed operation.

Figure 16:
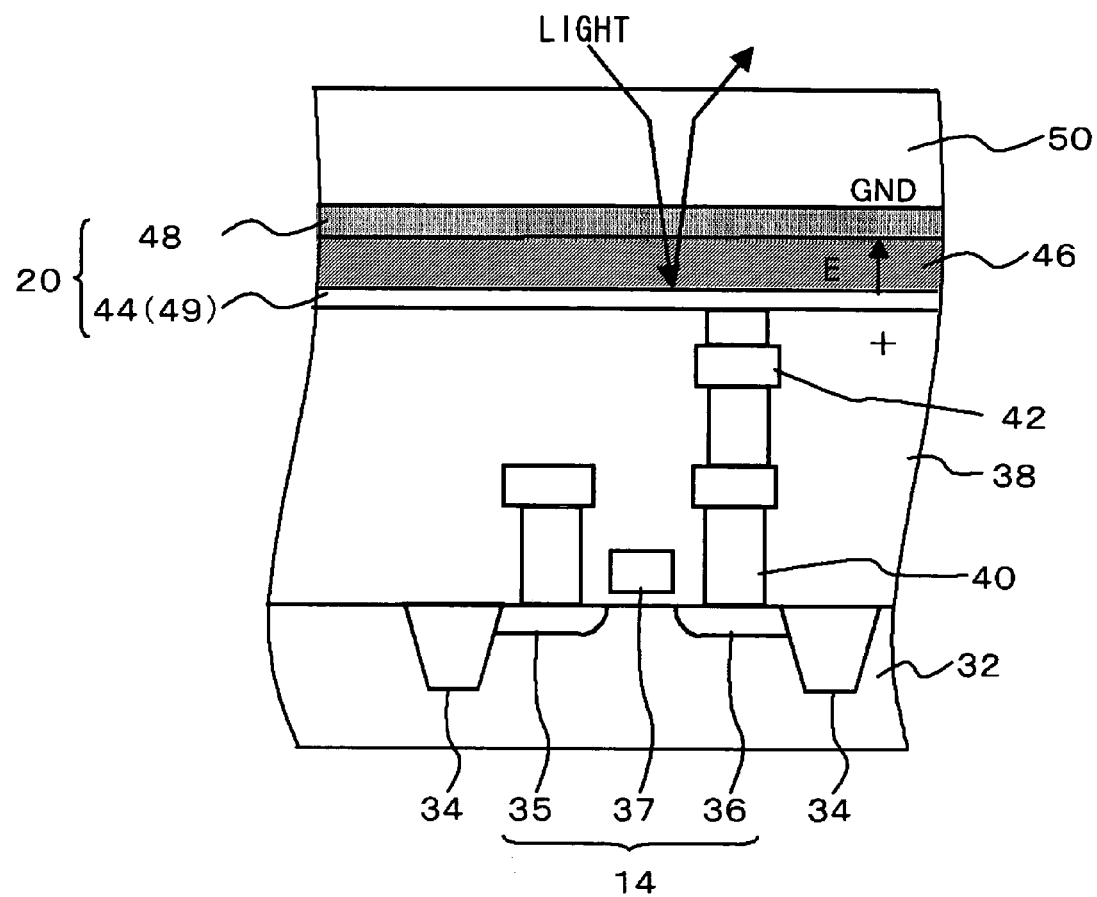
FIG. 16 is a circuit diagram showing another example of the light control unit shown in FIG. 1.

Incidentally, the optical control unit 8 according to the present embodiment may be configured as shown in FIG. 16. A difference from the configuration shown in FIG. 1 consists in that the reflecting film 44 is made of a conductive material and is used as the second electrode 49. Here, the reflecting film 44 is formed for each single pixel separately. The first electrode 48 may be a transparent electrode of ITO, $IrO_2$, or the like, formed on the entire surface of the light modulating film 46. Here, the electric field is applied in the direction of thickness of the light modulating film 46. Although not shown in FIG. 16, the light control unit 8 may also include the polarizing plate 52 as in the configuration of FIG. 1. This makes it possible to extract the light phase modulation visually. Incidentally, the light control unit 8 shown in FIG. 1 may also be configured without the polarizing plate 52.

As above, the light control unit 8 according to the present embodiment can be used as a display unit of reflection type. The first transistors 14 and the like can thus be formed on the side opposite from the display screen while the display screen is used broadly.

Second Embodiment

Figure 6:
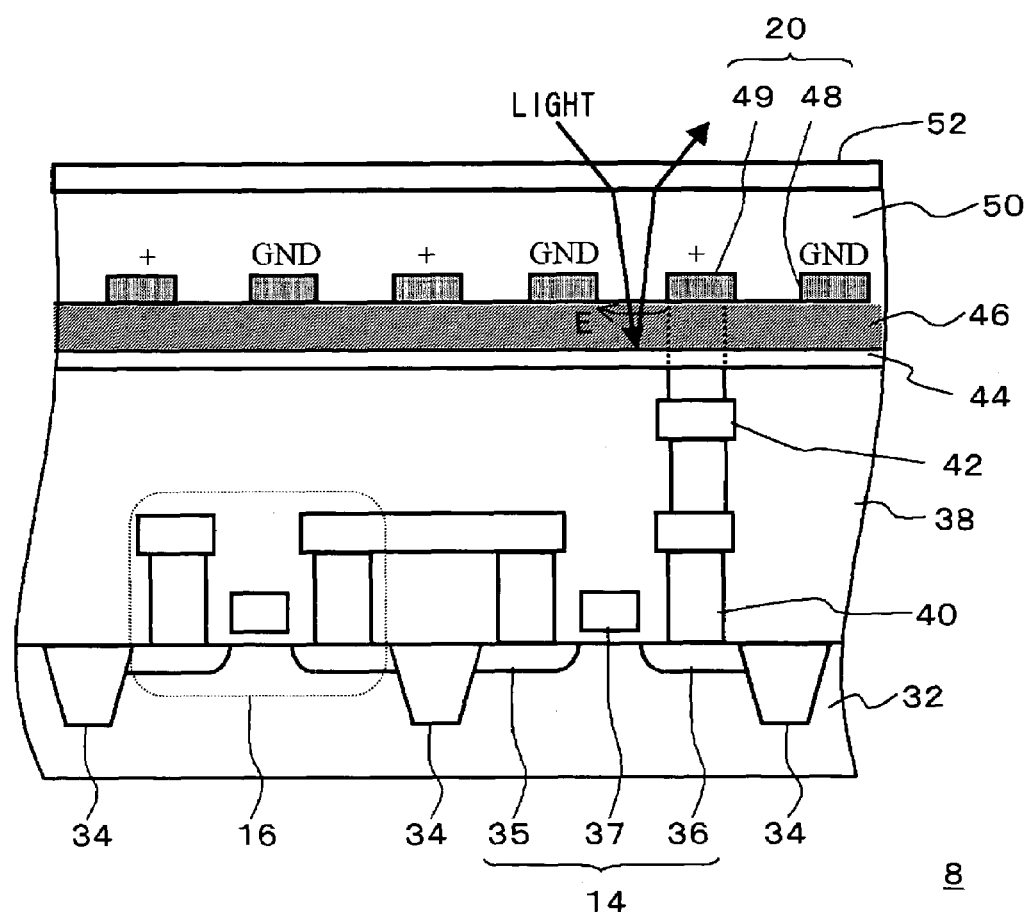
FIG. 6 is a partial sectional view showing the configuration of the light control unit according to a second embodiment of the present invention.

FIG. 6 is a partial sectional view showing the configuration of the light control unit 8 according to a second embodiment of the present invention. In the present embodiment, the same components as in the light control unit 8 of the first embodiment will be designated by identical reference numerals. Description thereof will be omitted as appropriate. The present embodiment differs from the first embodiment in that each pixel is provided with a plurality of transistors and a plurality of memory cells.

As in the first embodiment, the light control unit 8 includes a substrate 32, an insulating film 38, a reflecting film 44, a light modulating film 46, first and second electrodes 48 and 49, and a protection film 50. Moreover, a polarizing plate 52 is placed on the protection film 50.

Here, the substrate 32 and the insulating film 38 are provided with a second memory cell 16 which is a static random access memory (SRAM). The second memory cell 16 is formed in connection with the first transistor 14.

Figure 7:
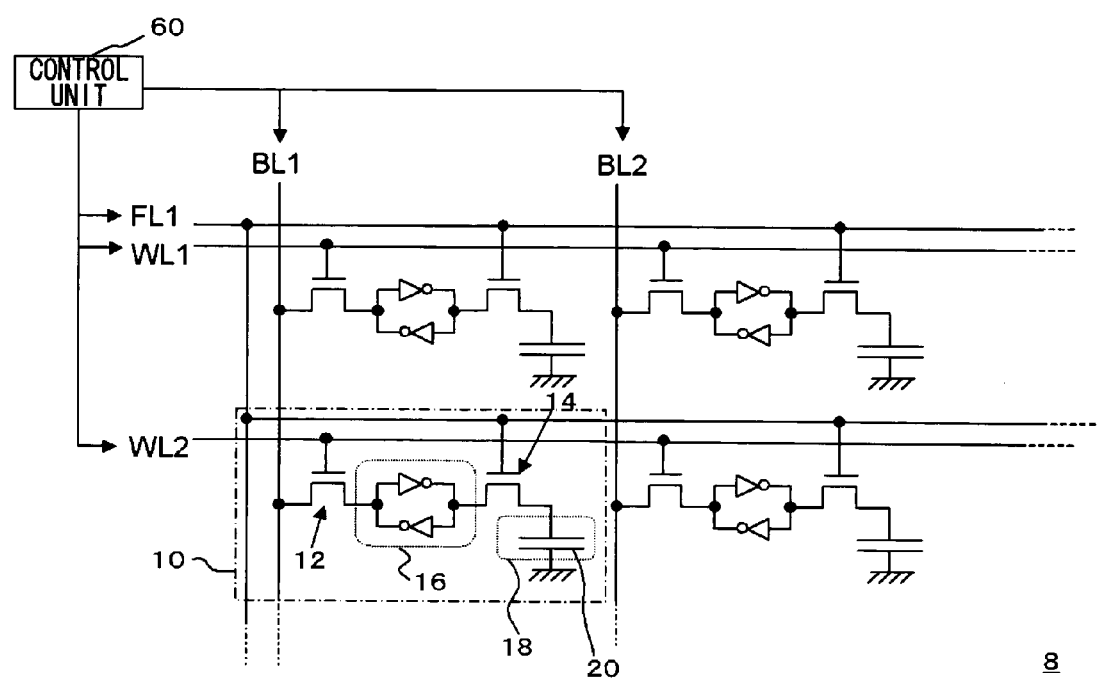
FIG. 7 is a circuit diagram showing the configuration of the light control unit shown in FIG. 6.

FIG. 7 is a circuit diagram showing the configuration of the light control unit 8 shown in FIG. 6.

Each pixel 10 includes a first transistor 14, a second transistor 12, a second memory cell 16, and an optical device 20. Again, the optical device 20 also functions as a first memory cell 18 which retains the brightness data of the optical device 20 for the current frame. The second memory cell 16 retains the brightness data of the optical device 20 for the next frame. The first transistor 14 functions as a switching device for transferring the brightness data retained in the second memory cell 16 to the first memory cell 18, thereby changing the brightness value of the optical device 20.

In the second transistor 12, the drain (or source) is connected to a bit line BL1, and the gate to a word line WL2. The source (or drain) is connected to the second memory cell 16. In the first transistor 14, the drain (or source) is connected to the second memory cell 16, and the gate to a switch line FL. The source (or drain) is connected to one of the electrodes of the optical device 20 (the second electrode 49 in FIG. 5). The other electrode of the optical device 20 (the first electrode 48 in FIG. 5) is grounded.

The optical devices 20 of all the pixels 10 that constitute the display screen emit light in accordance with the brightness data retained in the corresponding first memory cells 18. In the meantime, the control unit 60 selects the word line WL1 and the bit line BL1, the word line WL1 and the bit line BL2, . . . in succession, thereby turning on the second transistors 12 of the pixels in the first row and writing brightness data on the next frame to the corresponding second memory cells 16. When the writing of the brightness data to the second memory cells 16 of the pixels 10 in the first row is completed, the control unit 60 selects the word line WL2 and the bit line BL1, the word line WL2 and the bit line BL2, . . . in succession. The control unit 60 thereby writes brightness data on the next frame to the second memory cells 12 of the pixels 10 in the second row. In this way, while the brightness data on the current frame is displayed on all the pixels 10 of the light control unit 8 simultaneously, the control unit 60 writes the brightness data on the next frame to the individual pixels 10 in the background.

When the brightness data on the next frame is written to the second memory cells 16 of all the pixels 10 in the light control unit 8, the control unit 60 applies a predetermined voltage to the switch line FL. This turns on the first transistors 14 of all the pixels 10 almost at the same time. The brightness data on the next frame retained in the second memory cells 16 is thus transferred to the corresponding optical devices 20, respectively, so that the optical devices 20 of all the pixels 10 emit light in accordance with the brightness data on the next frame.

Subsequently, the control unit 60 performs the same processing, thereby writing brightness data on the subsequent frame to the second memory cells 16 of the respective pixels 10.

Figure 8:
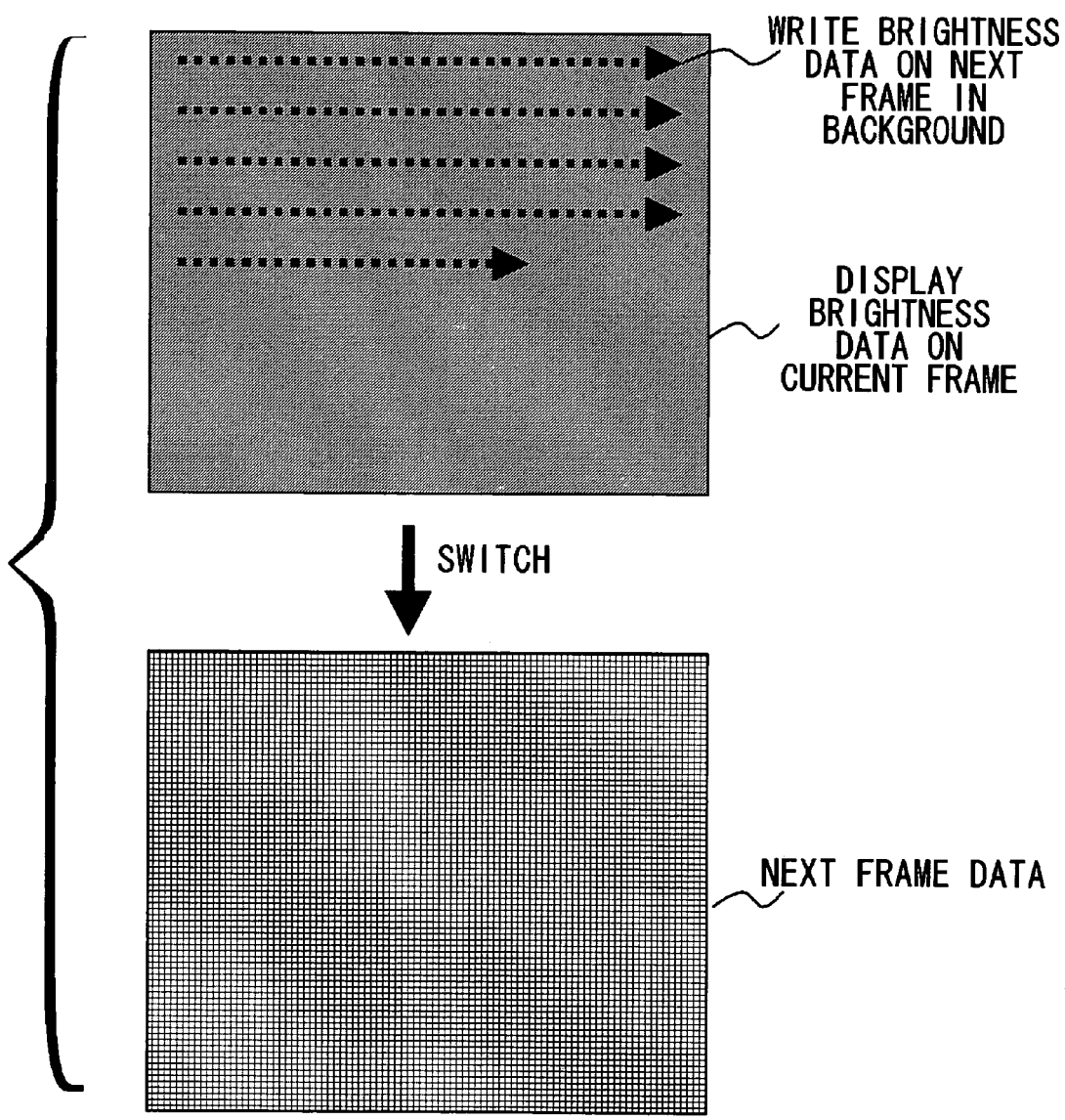
FIG. 8 is a schematic diagram showing how brightness data is written in the light control unit of the present embodiment.

FIG. 8 is a schematic diagram showing how brightness data is written in the light control unit 8 of the present embodiment. As shown in FIG. 7, the display screen shows the brightness data on the current frame. Here, the brightness data on the next frame is being written to the second memory cells 16 (see FIG. 7) of the respective pixels in the background. Meanwhile, the brightness data on the current frame is displayed on all the pixels. When the writing of the brightness data to the second memory cells 16 of all the pixels is completed in the background, the control unit 60 applies the predetermined voltage to the switch line FL. The display screen is thus switched so that the brightness data on the next frame appears on the display screen. Subsequently, the control unit 60 starts to write brightness data on the subsequent frame in the background again.

Consequently, while brightness data is being written to the individual pixels, the display screen shows brightness data on an identical frame. Thus, when the light control unit 8 according to the present embodiment is used as the spatial light modulator SLM of such a hologram recording apparatus 70 as shown in FIG. 4, the brightness data on the current frame is displayed on the light control unit 8 while brightness data on the next frame is written to all the pixels in the background. Since the writing of the brightness data and the recording of a hologram pattern on the recording medium 78 can thus be performed at the same time, it is possible to record the hologram pattern on the recording medium 78 efficiently. Moreover, the frames can be switched within an extremely short time since it is only physically necessary for the control unit 60 (FIG. 7) to apply the predetermined voltage to the switch line FL, turning on the first transistors 14. It is therefore possible to reduce the amount of time for recording a hologram pattern onto the recording medium 78.

Similarly, when the light control unit 8 according to the present embodiment is applied to an optical arithmetic unit such as shown in FIG. 5, logical operations can be performed at higher speed since it is possible to write brightness data on the next frame in the background while performing optical operations.

Figure 9:
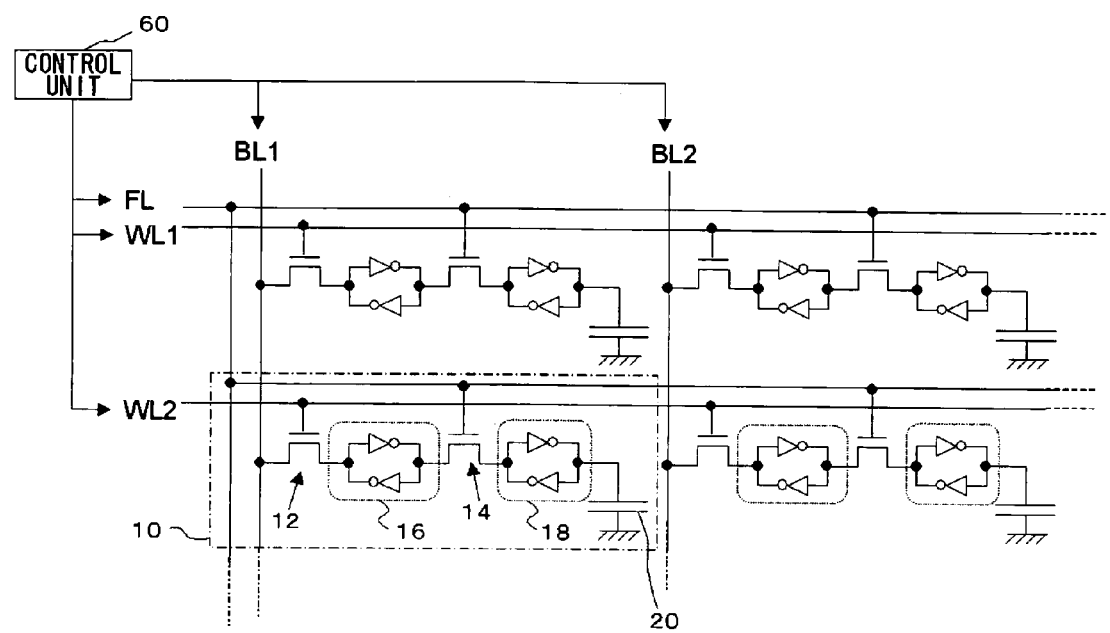
FIG. 9 is a circuit diagram showing another example of the light control unit according to the present embodiment.

FIG. 9 is a circuit diagram showing another example of the light control unit 8 according to the present embodiment. The light control unit 8 may include additional SRAMs as the first memory cells 18. When the second memory cells 16 and the first memory cells 18 both are thus made of SRAMs, it is possible to reduce transfer residue in transferring brightness data retained in the second memory cells 16 to the first memory cells 18. This makes it possible to transfer the brightness data with a higher degree of accuracy.

Now, description will be given of preferred materials of the light modulating film 46 according to the first and second embodiments of the present invention. The light modulating film 46 according to the embodiments preferably has the following capabilities:

(1) None of the brightness data on the previous frame remains when the brightness data to be displayed on the display screen is switched by the control unit 60; and (2) Deviations in the switching speed are small when the brightness data to be displayed on the display screen is switched by the control unit 60.

For materials that satisfy the foregoing capabilities, PLZT films to be described below are preferably used.

In the following embodiment, La composition shall refer to the ratio of the number of La atoms to the sum of the numbers of Zr and Ti atoms, unless otherwise specified.

(First PLZT Film)

A first PLZT film is one formed by a sol-gel method on a reflecting film (Pt) which is formed on a silicon substrate. The fabrication method will be described below.

Initially, a silicon oxide film is formed on the silicon substrate, and the Pt film is formed thereon. A mixed solution containing metal alkoxides of Pb, La, Zr, and Ti is spin-coated on the surface of the Pt film. Examples of the starting materials, or metal alkoxides, include $Pb(CH_2COO)_2 \cdot 9 \, 3H_2O$, $La(O\text{-i-}C_3H_7)_3$, $Zr(O\text{-t-}C_4H_9)_4$, and $Ti(O\text{-i-}C_3H_7)_4$.

The atomic composition in the mixed solution shall be one from which the quadratic electrooptic effect is obtained in the phase diagram of FIG. 8. In the present embodiment, Pb:La:Zr:Ti=105:9:65:35. The thickness of the mixed solution is around 100 nm to 5 μm, for example.

After the spin-coating, drying is performed at predetermined temperatures, followed by pre-firing in a dry air atmosphere. For example, the drying temperature is between 100° C. and 250° C. A temperature of 200° C. is employed here. The pre-firing can be performed at or above 300° C., and preferably at or above 400° C. This can remove organic matters, moisture, and residual carbon with reliability. The duration of the pre-firing is 1 minute to 1 hour or so, for example. Before the pre-firing, the application and drying of the solution may be repeated until the predetermined thickness is reached.

Subsequently, heat treatment is applied in an $O_2$ atmosphere so that PLZT is crystallized for grain growth. For example, the heat treatment temperature is between 600° C. and 750° C. This range of temperatures can crystallize PLZT with reliability. The heat treatment temperature is preferably at or above 700° C. This can increase the average grain size of the crystals. The specific surface areas of the grains can thus be reduced for suppressed La precipitation. The duration of the heat treatment may be between 10 seconds and 5 minutes, for example, and preferably 1 minute or longer. This can make the grains even greater.

After the heat treatment is completed, the crystallized PLZT film is cooled rapidly. This cooling process is typically conducted at a rate of around 400° C./min to 1000° C./min. This makes it difficult, however, to introduce lanthanum into the PLZT grains in high concentrations. Specifically, for example, if the material composition reaches or exceeds 7% in the percentage of the number of La atoms with respect to the sum of the numbers of Zr and Ti atoms, it becomes extremely hard to introduce the same concentration of lanthanum into the grains as in the material composition. Then, in the present embodiment, a higher cooling rate is employed in the process of cooling after the heat treatment. The cooling rate may be higher than 1200° C./min, such as 1800° C./min, for example.

Through the foregoing steps, a structure having the PLZT thin film formed on the silicon substrate is obtained. This PLZT thin film has a high La composition with a La content in the range of 5 at % and 30 at %. The PLZT obtained by the foregoing steps was measured for relative dielectric constant at a frequency of 1 MHz, and found to be 1200. From this value, it is considered that a sufficient amount of La is taken into the grains of the PLZT obtained in the present embodiment.

(Second PLZT Film)

A second PLZT film is fabricated by forming a seed layer on the Pt film formed on the silicon substrate, and then spin-coating a metal alkoxide layer thereon. The formation of the seed layer makes it possible to obtain a uniform PLZT film having excellent crystallinity. It is also possible to form a PLZT film having greater grain sizes stably.

A mixed solution for forming the seed layer is a liquid that contains seed particles, a surface-active agent of around 0.1% to 10% by weight, and an organic solvent. This mixed solution is applied onto the silicon substrate by spin coating or the like, thereby forming the seed layer. Since the formation of such a seed layer promotes favorable crystallization with the seed particles as cores, it becomes possible to obtain a uniform PLZT film having excellent crystallinity.

For example, Ti ultra-fine particles may be used as the seed particles. The Ti ultra-fine particles desirably have particle sizes of around 0.5 nm to 200 nm, and preferably 1 nm to 50 nm or so. By the way, in order for ultra-fine particles to make a core, a certain number of atoms are required. Cores are not made of a single atom, and desirably have sizes sufficiently greater than those of the atoms of 0.1 nm or so. If the cores are too large, on the other hand, the centers of the Ti cores will remain intact. This in turn requires high annealing temperatures so as not to leave Ti. In addition, sizes exceeding 200 nm make it difficult to form a flat uniform PLZT film. The greater the cores, the harder to disperse into the solvent, too.

The seed particles desirably have a concentration of around 0.00001% (0.1 ppm) to 1% by weight. The Ti ultra-fine particles are coated around with the surface-active agent in the mixed solution.

For the organic solvent, α-terpineol is used suitably. Aside from this, xylene, toluene, 2-methoxyethanol, and butanol may also be used.

When forming the seed layer, the application of the mixed solvent is preferably followed by drying and firing. The drying can be performed, for example, at around 200° C. to 400° C. for about 1 to 10 minutes. This can remove the solvent. The firing may be performed at temperatures for crystallizing the seed layer. In general, heating at around 450° C. to 750° C. for about 1 to 10 minutes will suffice.

According to the method described above, it is possible to stably form a film having the following properties:

La composition: between 5 at % and 30 at %;

Relative dielectric constant (at a frequency of 1 MHz): 1200 or higher;

Average grain size of PLZT: 800 nm or greater;

X-ray diffraction characteristic of PLZT: I(111)/I(110) not lower than 1

(where I(110) is the X-ray diffraction intensity on the (110) plane of PLZT, and I(111) is the X-ray diffraction intensity on the (111) plane); and Peak half width of the X-way diffraction on the (111) plane of PLZT: 5° or less.

Films having these properties are high in Kerr constant and show an excellent quadratic electrooptic effect. These films can thus be used suitably as the light modulating film 46 according to the first and second embodiments of the present invention.

PRACTICAL EXAMPLES (Fabrication of PLZT Film)

Pt films were formed on silicon substrates by sputtering, and films of PLZT were formed on the Pt films by the sol-gel method. The Pt films had a thickness of approximately 150 nm.

The mixed solution for forming PLZT had metal atom ratios of Pb:La:Zr:Ti=105:9:65:35. The mixed solution was initially applied onto the Pt films by spin coating. The articles were heated at 150° C. for 30 minutes for pre-baking, and then at 450° C. for 60 minutes for pre-firing. This series of steps was repeated four times before final firing was performed in an oxygen atmosphere at 700° C. for one minute. After the firing, the PLZT films were cooled at the respective cooling rates shown in Table 1, whereby the samples were obtained.

(Evaluations)

The samples 1 to 3 in Table 1 were individually measured for the refractive index n, the relative dielectric constant ∈, the Kerr constant R, and the grain size. D. The samples 1 and 3 were also measured for X-ray diffraction spectra.

Incidentally, the refractive indexes of the samples were calculated from their absorbances to 633-nm light. The relative dielectric constants of the samples were measured in an AC electric field of 1 MHz. The average grain sizes of the crystals in the films were observed under a scanning electron microscope (SEM). The X-ray diffraction measurement was conducted on the condition of θ/2θ scanning, with X-rays having a wavelength of CuKα: 1.5418 Å.

TABLE 1

| SAMPLE No. | COOLING RATE (° C. min$^{-1}$) | REFRACTIVE INDEX n | RELATIVE DIELECTRIC CONSTANT $\epsilon$ (×10$^3$) | KERR CONSTANT (×10$^{-15}$m$^2$v$^{-2}$) | GRAIN SIZE (nm) | X-RAY DIFFRACTION INTENSITY RATIO I(111)/I(110) | X-RAY DIFFRACTION PEAK HALF WIDTH (DEGREES) | ESTIMATED STRUCTURE |
|---|---|---|---|---|---|---|---|---|
| 1 | 400 | 2.46 | 0.90 | 0.00 | 200 | 0.5 | 5.4 | PZT + La |
| 2 | 1200 | 2.76 | 1.16 | 0.01 | 200 | — | — | PZT + La |
| 3 | 1800 | 3.05 | 1.20 | 0.05 | 1000 | 30 | 4.1 | PLZT |

(Measurements)

Figure 10:
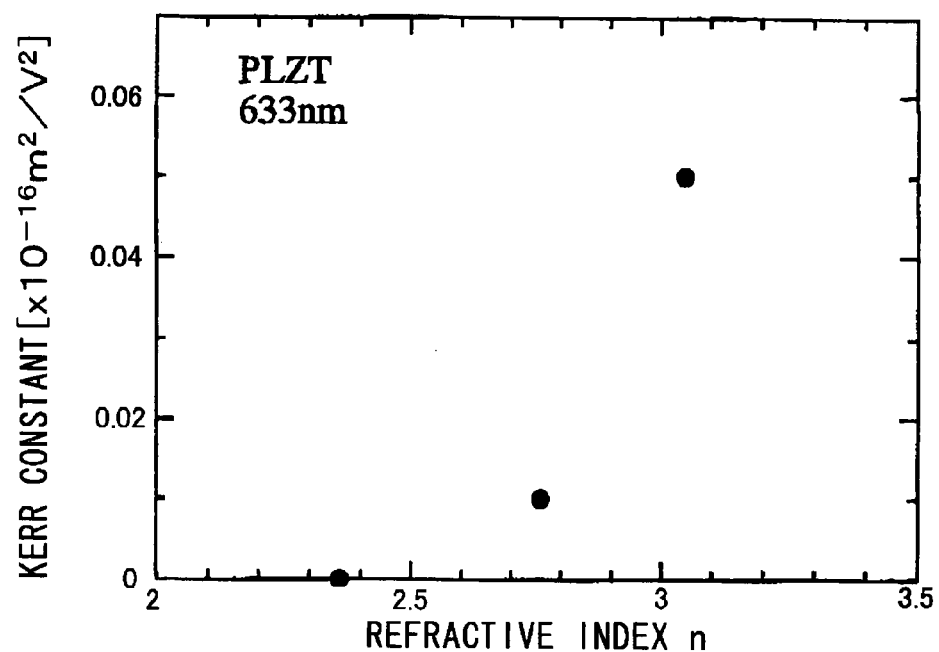
FIG. 10 is a chart showing the relationship between the refractive index and Kerr constant of PLZT films according to practical examples.
Figure 11:
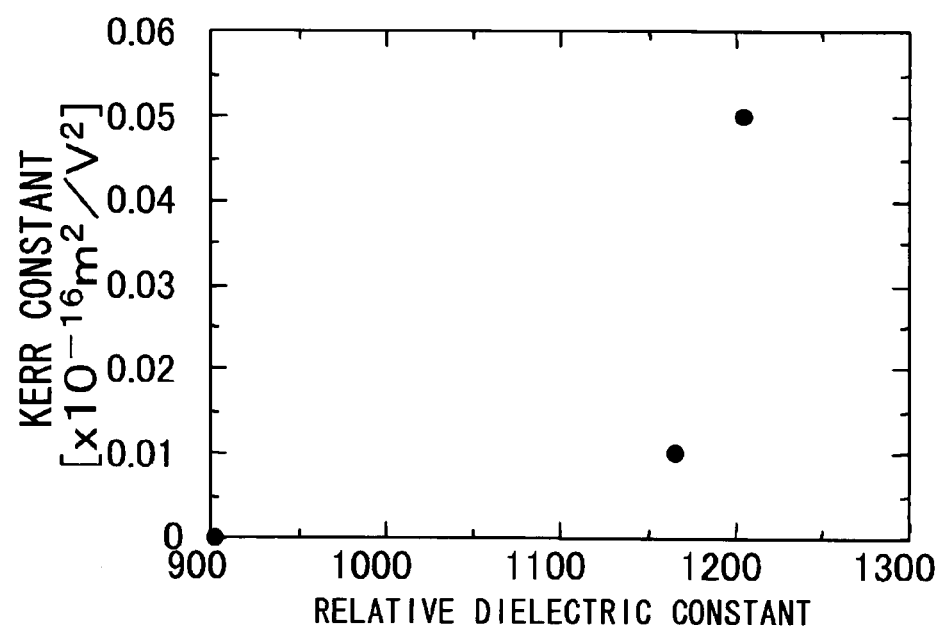
FIG. 11 is a chart showing the relationship between the relative dielectric constant and Kerr constant of the PLZT films according to the practical examples.
Figure 12:
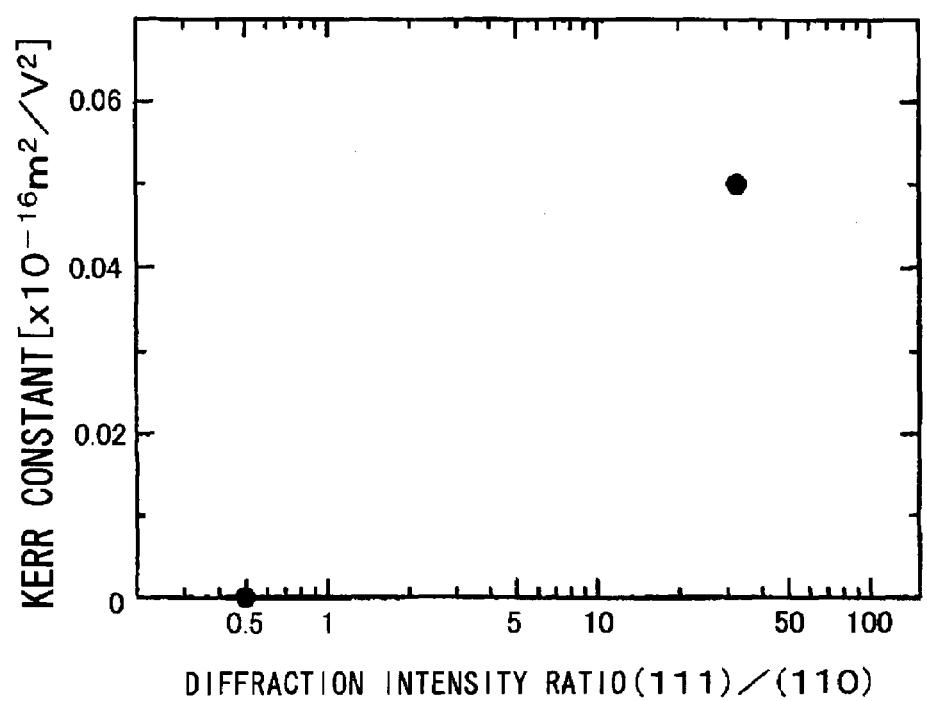
FIG. 12 is a chart showing the relationship between the X-ray diffraction peak strength and Kerr constant of the PLZT films according to the practical examples.
Figure 13:
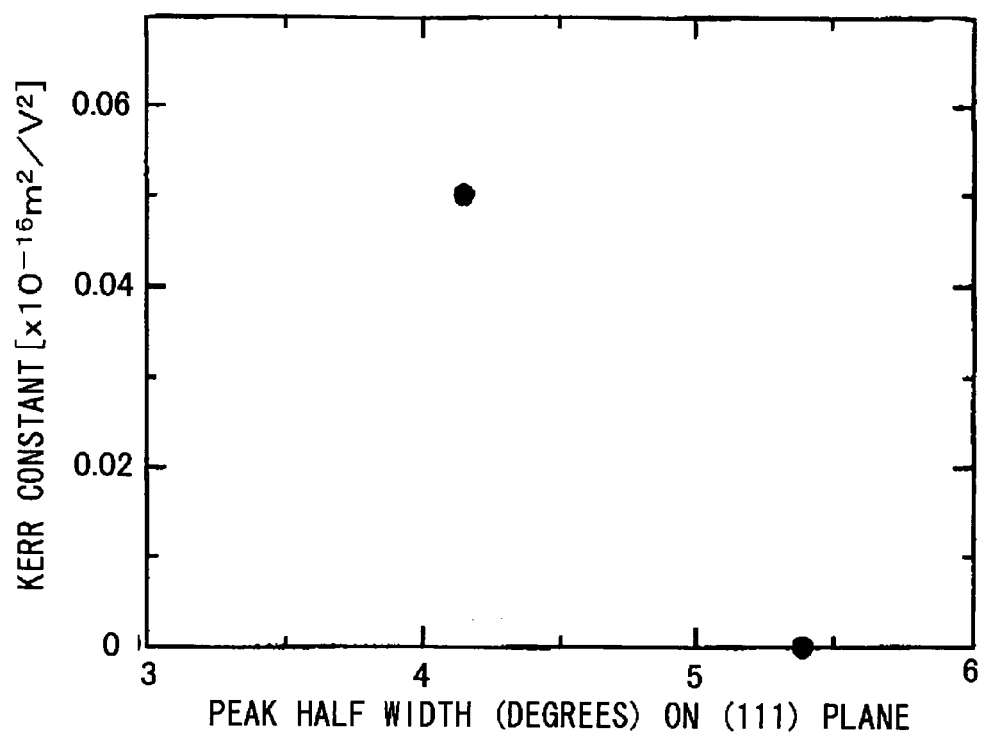
FIG. 13 is a chart showing the relationship between the X-ray diffraction peak half-width and Kerr constant of the PLZT films according to the practical examples.
Figure 14:
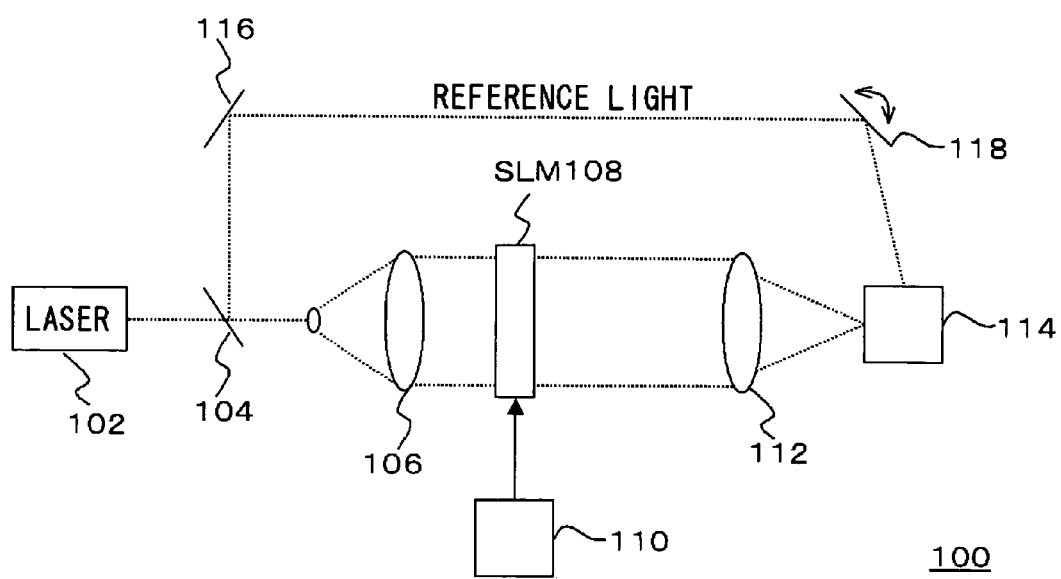
FIG. 14 is a diagram showing an example of a hologram recording apparatus.
Figure 15:
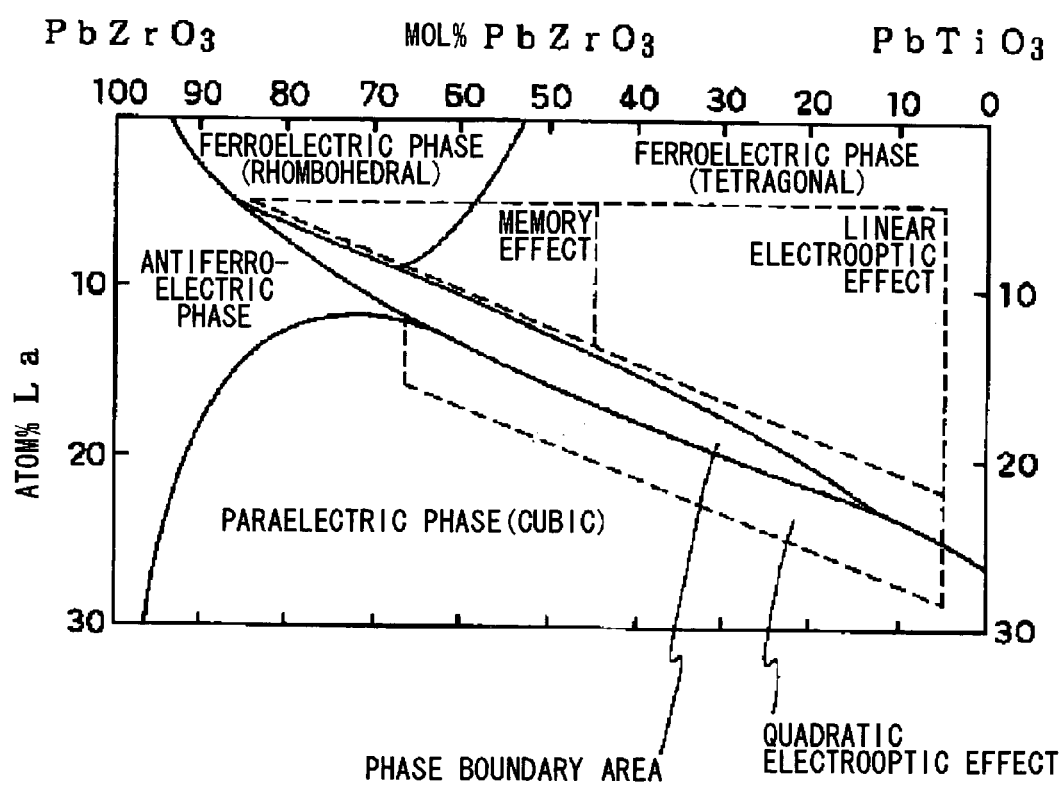
FIG. 15 is a diagram showing the state of phase of PLZT.

Table 1 shows the measurements on the physical properties of the samples. FIG. 10 shows the relationship between the refractive index n and the Kerr constant R of the samples. FIG. 11 shows the relationship between the relative dielectric constant $\in$ and Kerr constant R of the samples. FIG. 12 shows the ratios between the peak intensities on the (111) plane (peak 2θ=approximately 38°) and the (110) plane (peak 2θ=approximately 31°) in the X-ray diffraction spectra of the samples, being plotted in relation to the Kerr constant R. FIG. 13 shows the relationship between the half width on the (111) plane (peak 2θ=approximately 380) in the X-ray diffraction spectra and the Kerr constant.

From FIGS. 10 and 11 and Table 1, it can be seen that high Kerr constants are obtained from PLZT films having refractive indexes of 2.8 and above, or relative dielectric constants of 1200 and above. It is also shown that an average grain size of approximately 1 μm provides a high Kerr constant.

These measurements suggest that in the sample 3, La in the crystals is taken into the grains because of the rapid cooling after the firing. Moreover, since the specific surface area increases with increasing average grain size, it seems possible to suppress the precipitation of La oxides (such as La$_2$O$_3$).

Meanwhile, in the sample 1, it can be seen that an additive rule holds for the refractive indexes in the PZT phase and the La phase (La-oxide phase). This suggests that the small cooling rate precipitates La oxides, so that both the PZT phase and the La phase are formed inside the film.

What can be seen from the results of FIGS. 12 and 13 are as follows. Incidentally, the PLZT films seem to contain both cubic and tetragonal grains.

The results of FIG. 12 show that the orientation of the entire film toward the (111) plane can be increased to improve the quadratic electrooptic effect. The reason seems that the increased orientation toward the (111) plane can reduce deviations in orientation between crystal grains. In addition, it is evident from FIG. 13 that the peak half width on the (111) plane can also be reduced to improve the quadratic electrooptic effect. The reason seems to be that the reduced peak half width improves the crystallinity of the entire film.

Up to this point, the present invention has been described in conjunction with the embodiments and practical examples thereof. These embodiments and practical examples are given solely by way of illustration. It will be understood by those skilled in the art that various modifications may be made thereto, and all such modifications are also intended to fall within the scope of the present invention.

The light control unit according to at least an embodiment of the present invention may be applied to spatial light modulators SLM of hologram recording/reproducing apparatuses, display units, optical communication switches, optical communication modulators, optical arithmetic units, encryption circuits, etc.

While the preferred embodiments of the present invention have been described using specific terms, such description is for illustrative purposes only, and it is to be understood that changes and variations may be made without departing from the spirit or scope of the appended claims. Then presently disclosed embodiments are therefore to be considered in all respects as illustrative and not restrictive, and all changes which come within the meaning and range of equivalency of the claims are therefore intended to be embraced therein. While the preferred embodiments of the present invention have been described using specific terms, such description is for illustrative purposes only, and it is to be understood that changes and variations may be made without departing from the spirit or scope of the appended claims.

What is claimed is:

1. A light control unit comprising:
    a substrate;
    a reflecting film formed on the substrate;
    a solid light modulating film formed on the reflecting film, the light modulating film being made of a material that varies in refractive index in accordance with an electric field applied thereto;
    an insulating film interposed between the substrate and the reflecting film, a switching device being formed in the insulating film; and
    an electrode formed on the light modulating film;
    wherein the switching device of the electrode is interposed between the substrate and the reflecting film.

2. The light control unit according to claim 1, further comprising a memory cell which retains data to be applied to the electrode, the memory cell being interposed between the substrate and the reflecting film.

3. The light control unit according to claim 1, further comprising wiring laid between the substrate and the reflecting film, in connection with the electrode.

4. The light control unit according to claim 1, wherein the light modulating film is made of a material that varies in refractive index in proportion to the square of the electric field applied thereto.

5. The light control unit according to claim 1, wherein the light modulating film is made of PLZT containing Pb, Zr, Ti, and La as constituent elements.

6. The light control unit according to claim 1, wherein the light modulating film has a relative dielectric constant of 1200 or higher at a frequency of 1 MHz.

7. The light control unit according to claim 1, wherein the light modulating film is made of polycrystalline PLZT containing Pb, Zr, Ti, and La as constituent elements, and has a La content within a range of 5 at % to 30 at %.

8. A light control unit comprising:
a substrate;
a reflecting film formed on the substrate;
a solid light modulating film formed on the reflecting film, the light modulating film being made of a material that varies in refractive index in accordance with an electric field applied thereto;
an insulating film interposed between the substrate and the reflecting film, a switching device being formed in the insulating film;
an electrode formed on the light modulating film;
wherein the switching device of the electrode is interposed between the substrate and the reflecting film; and
wherein the electrode includes a plurality of pairs of electrodes arranged in a matrix.

9. The light control unit according to claim 8, wherein the pair of electrodes may be formed in a comb shape each and arranged so that their teeth are staggered and opposed to each other.

10. The light control unit according to claim 8, further comprising a memory cell which retains data to be applied to the electrode, the memory cell being interposed between the substrate and the reflecting film.

11. The light control unit according to claim 8, further comprising wiring laid between the substrate and the reflecting film, in connection with the electrode.

12. The light control unit according to claim 8, wherein the light modulating film is made of a material that varies in refractive index in proportion to the square of the electric field applied thereto.

13. The light control unit according to claim 8, wherein the light modulating film is made of PLZT containing Pb, Zr, Ti, and La as constituent elements.

14. The light control unit according to claim 8, wherein the light modulating film has a relative dielectric constant of 1200 or higher at a frequency of 1 MHz.

15. The light control unit according to claim 8, wherein the light modulating film is made of polycrystalline PLZT containing Pb, Zr, Ti, and La as constituent elements, and has a La content within a range of 5 at % to 30 at %.

* * * * *